(12) United States Patent
Simpkins

(10) Patent No.: US 10,408,384 B2
(45) Date of Patent: Sep. 10, 2019

(54) THERMAL CONTACT BETWEEN CRYOGENIC REFRIGERATORS AND COOLED COMPONENTS

(71) Applicant: Michael Simpkins, Buckinghamshire (GB)

(72) Inventor: Michael Simpkins, Buckinghamshire (GB)

(73) Assignee: Siemens Healthcare Limited, Camberley (GB)

( * ) Notice: Subject to any disclaimer, the term of this patent is extended or adjusted under 35 U.S.C. 154(b) by 0 days.

(21) Appl. No.: 16/059,172

(22) Filed: Aug. 9, 2018

(65) Prior Publication Data
US 2018/0372393 A1   Dec. 27, 2018

Related U.S. Application Data

(62) Division of application No. 14/785,068, filed as application No. PCT/EP2014/057725 on Apr. 16, 2014, now Pat. No. 10,253,928.

(30) Foreign Application Priority Data

Apr. 17, 2013 (GB) .................................. 1306966.1

(51) Int. Cl.
*F17C 3/08* (2006.01)
*F25B 9/14* (2006.01)
(Continued)

(52) U.S. Cl.
CPC ................. *F17C 3/085* (2013.01); *F25B 9/14* (2013.01); *F25D 19/006* (2013.01); *F28F 13/18* (2013.01);
(Continued)

(58) Field of Classification Search
CPC .............. F17C 3/085; F17C 2227/0353; F25D 19/006; F28F 13/18; F25B 9/14; H01F 6/04
(Continued)

(56) References Cited

U.S. PATENT DOCUMENTS 2,983,106 A * 5/1961 Kugler ..................... F17C 9/02
62/383
3,609,992 A   10/1971 Cacheux
(Continued)

FOREIGN PATENT DOCUMENTS

EP   3232143 A1 * 10/2017 ............... F25B 9/145
GB   2463659 A * 3/2010 ......... G01R 33/3804
(Continued)

*Primary Examiner* — Cassey D Bauer
*Assistant Examiner* — Jenna M Hopkins
(74) *Attorney, Agent, or Firm* — Schiff Hardin LLP

(57) ABSTRACT

An arrangement for mounting a two stage cryogenic refrigerator into a cryostat has a vacuum sock accommodates at least a part of the refrigerator, attachment means and attaches an upper part of the refrigerator to a surface of the cryostat around an opening of the vacuum sock, a thermally conductive portion of a wall of the vacuum sock that, in use, is thermally and mechanically in contact with a second cooling stage of the refrigerator, and arrangements are provided that thermally connect a first stage of the refrigerator to a thermal radiation shield of the cryostat.

4 Claims, 19 Drawing Sheets

(51) Int. Cl.
*H01F 6/04* (2006.01)
*F25D 19/00* (2006.01)
*F28F 13/18* (2006.01)
*G01R 33/38* (2006.01)
*G01R 33/3815* (2006.01)

(52) U.S. Cl.
CPC ........ *H01F 6/04* (2013.01); *F17C 2227/0353* (2013.01); *G01R 33/3804* (2013.01); *G01R 33/3815* (2013.01)

(58) Field of Classification Search
USPC .................................................... 62/51.1, 6
See application file for complete search history.

(56) References Cited

U.S. PATENT DOCUMENTS

| | | | |
|---|---|---|---|
| 3,957,107 A * | 5/1976 | Altoz | F28D 15/06 165/276 |
| 3,999,403 A | 12/1976 | Bower et al. | |
| 4,281,708 A * | 8/1981 | Wing | F28F 27/00 165/277 |
| 4,388,965 A * | 6/1983 | Cunningham | G05D 23/192 165/185 |
| 4,526,015 A | 7/1985 | Laskaris | |
| 4,606,201 A | 8/1986 | Longsworth | |
| 4,827,736 A * | 5/1989 | Miura | F25B 9/10 62/51.1 |
| 4,930,318 A | 6/1990 | Brzozowski | |
| 5,044,165 A | 9/1991 | Linner et al. | |
| 5,333,464 A * | 8/1994 | Laskaris | F25D 19/006 335/216 |
| 5,379,602 A * | 1/1995 | Sipila | F17C 13/006 62/383 |
| 5,522,226 A | 6/1996 | Mruzek | |
| 5,611,207 A | 3/1997 | Hess | |
| 5,737,927 A | 4/1998 | Takahashi et al. | |
| 5,828,280 A | 10/1998 | Spivey, Jr. et al. | |
| 6,246,308 B1 | 6/2001 | Laskaris et al. | |
| 6,371,199 B1 | 4/2002 | Gebhart | |
| 7,667,476 B2 | 2/2010 | Zogmal et al. | |
| 8,516,909 B2 | 8/2013 | Lihl et al. | |
| 8,910,486 B2 | 12/2014 | Bin-Nun et al. | |
| 2002/0005043 A1 * | 1/2002 | Rudick | F25B 9/14 62/6 |
| 2002/0134089 A1 * | 9/2002 | Rudick | A47F 3/0443 62/6 |
| 2004/0008853 A1 * | 1/2004 | Pelrine | A61M 5/142 381/191 |
| 2004/0145366 A1 | 7/2004 | Baudenbacher et al. | |
| 2005/0120721 A1 * | 6/2005 | O'Baid | F25B 9/14 62/6 |
| 2006/0207265 A1 | 9/2006 | Sorsby | |
| 2006/0207266 A1 | 9/2006 | Belton et al. | |
| 2007/0089432 A1 | 4/2007 | Boesel et al. | |
| 2008/0036463 A1 | 2/2008 | Hsieh et al. | |
| 2008/0092557 A1 | 4/2008 | Mraz et al. | |
| 2008/0104968 A1 * | 5/2008 | Radovinsky | F25D 19/006 62/6 |
| 2008/0115510 A1 | 5/2008 | Crowley et al. | |
| 2008/0314560 A1 * | 12/2008 | Grayson | F28F 13/00 165/96 |
| 2009/0272127 A1 * | 11/2009 | Radovinsky | F25D 19/006 62/50.7 |
| 2010/0000232 A1 | 1/2010 | Valentian | |
| 2011/0266465 A1 * | 11/2011 | Shichi | H01J 27/26 250/492.3 |
| 2014/0130520 A1 * | 5/2014 | Snow | F25B 9/14 62/6 |
| 2016/0327139 A1 * | 11/2016 | Edgley | H01F 6/04 |
| 2017/0211859 A1 * | 7/2017 | Blaauwgeers | B01D 8/00 |
| 2019/0003652 A1 * | 1/2019 | Stautner | F17C 13/06 |

FOREIGN PATENT DOCUMENTS

| | | | |
|---|---|---|---|
| JP | 52067288 A | * | 6/1977 |
| JP | 352067288 A | | 6/1977 |
| JP | S57169564 A | | 10/1982 |
| JP | H03269326 A | | 11/1991 |
| JP | 2016211803 A | * | 12/2016 |

* cited by examiner

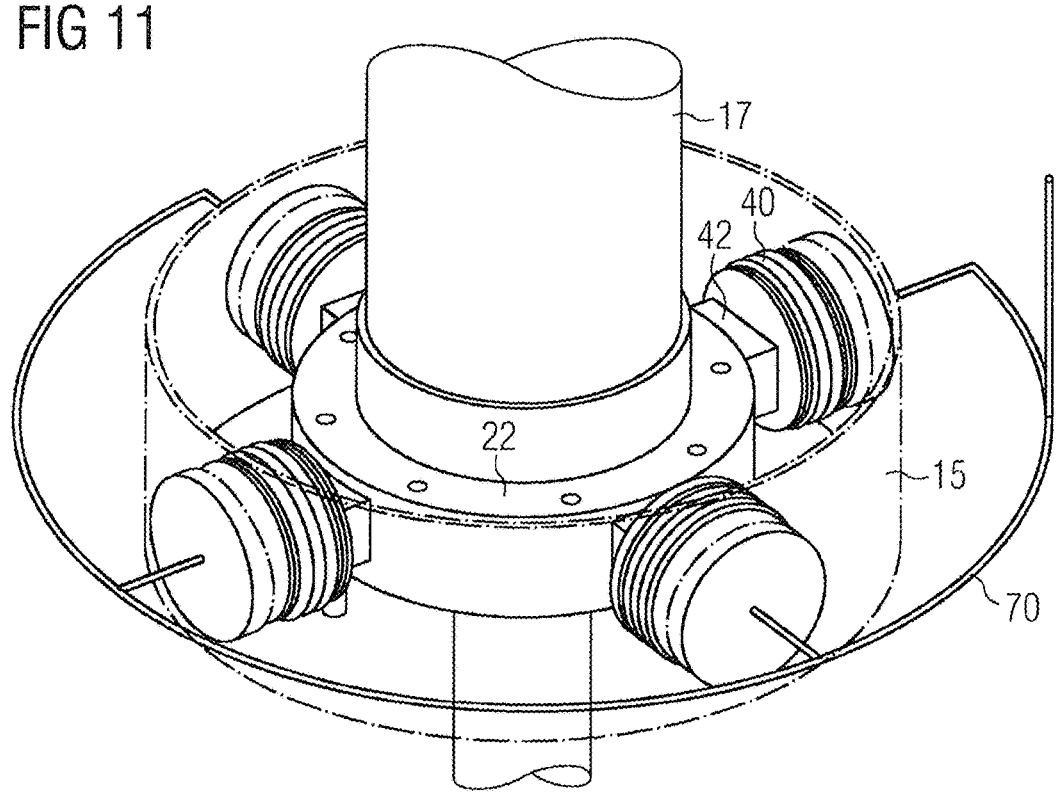

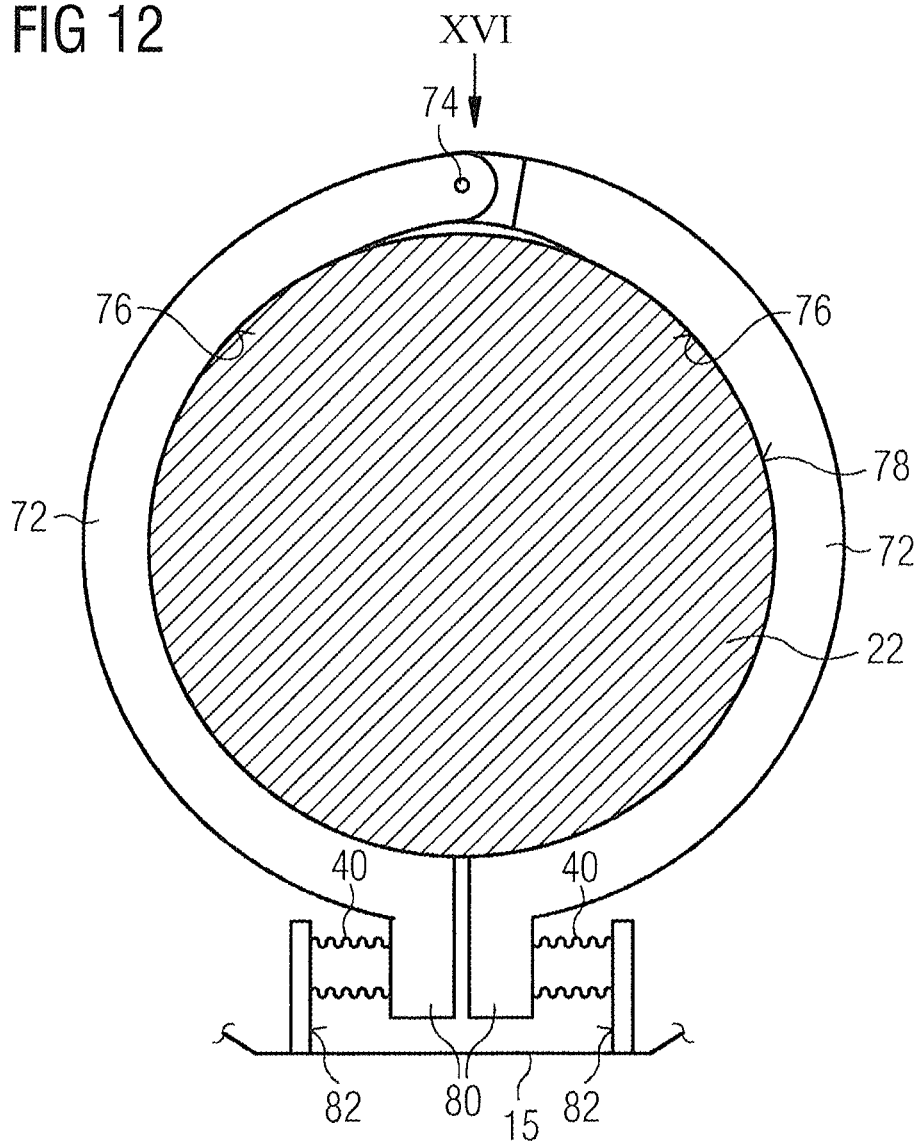

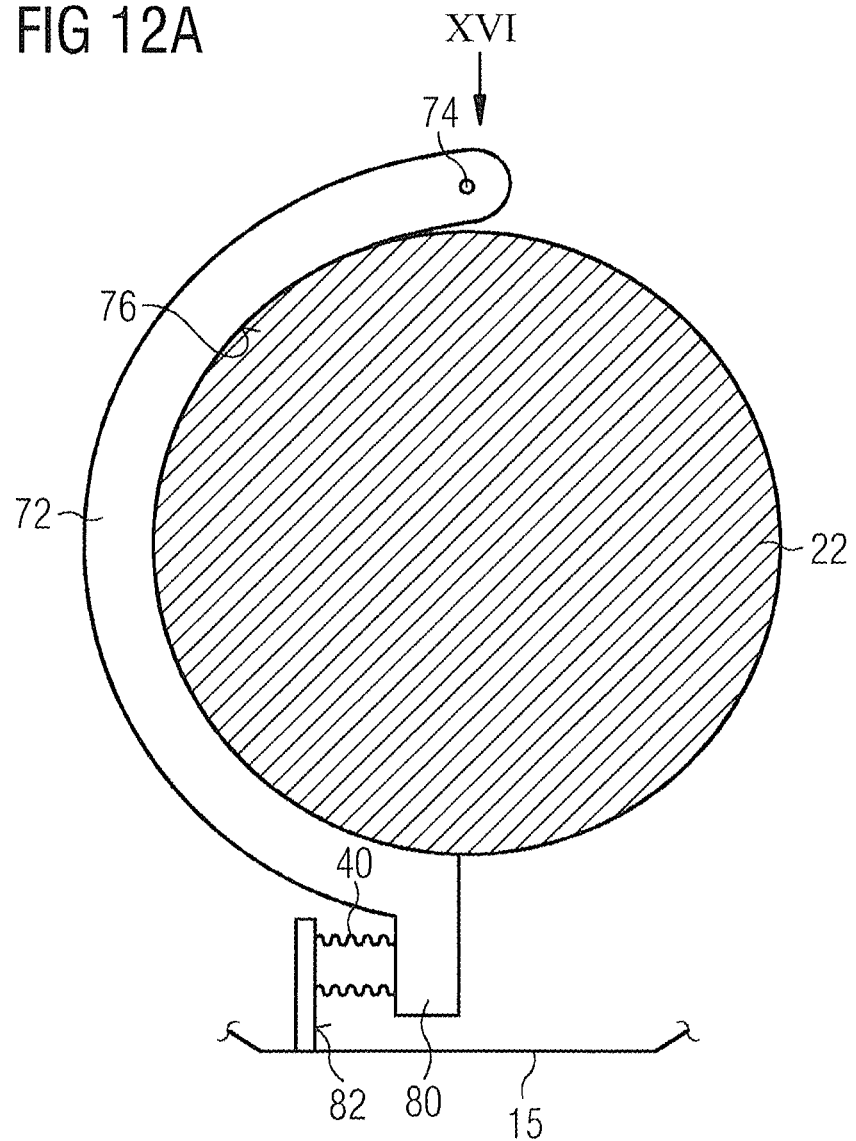

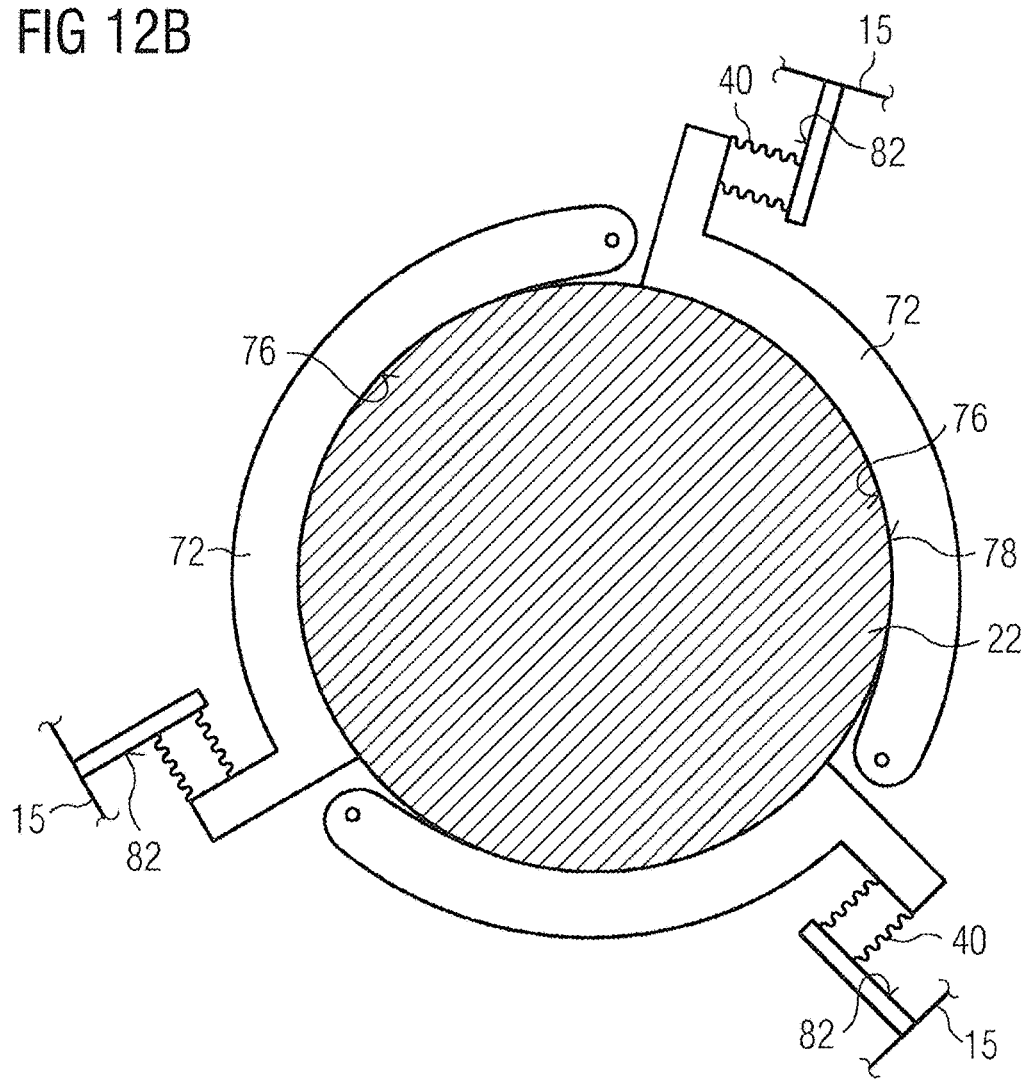

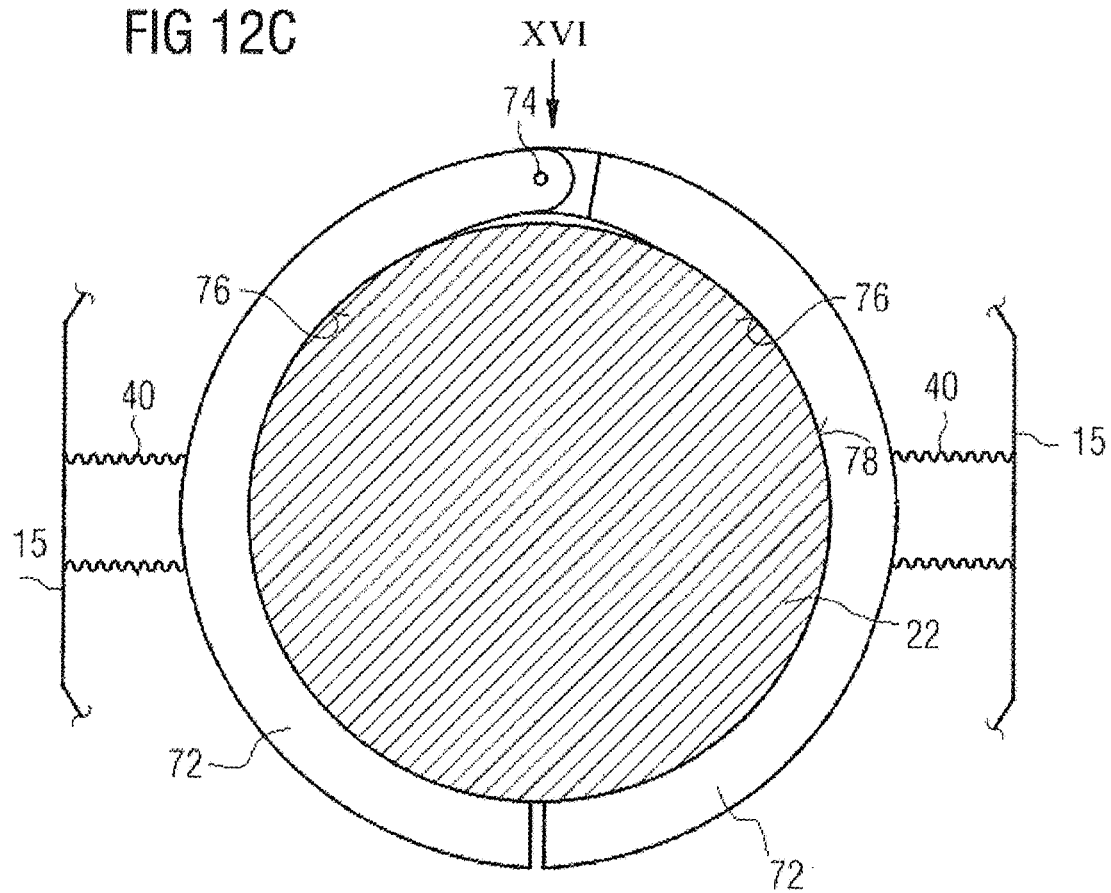

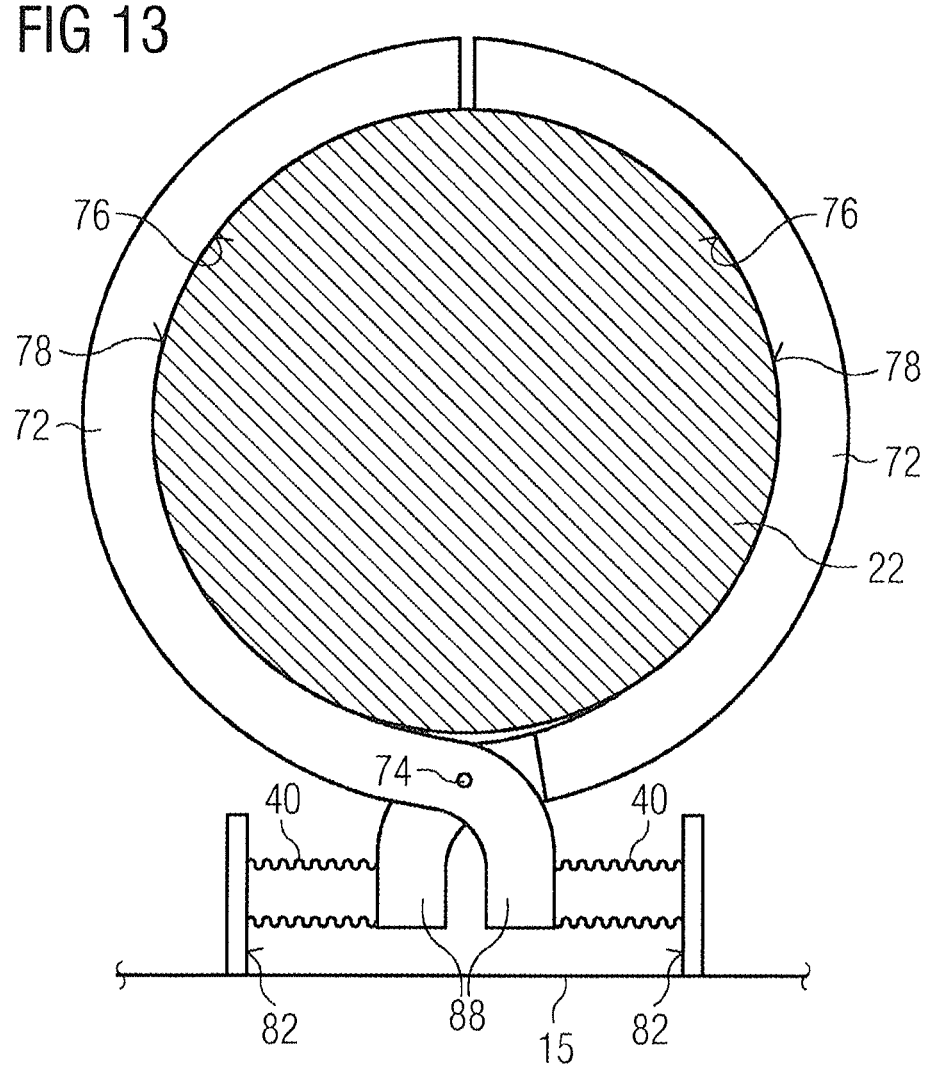

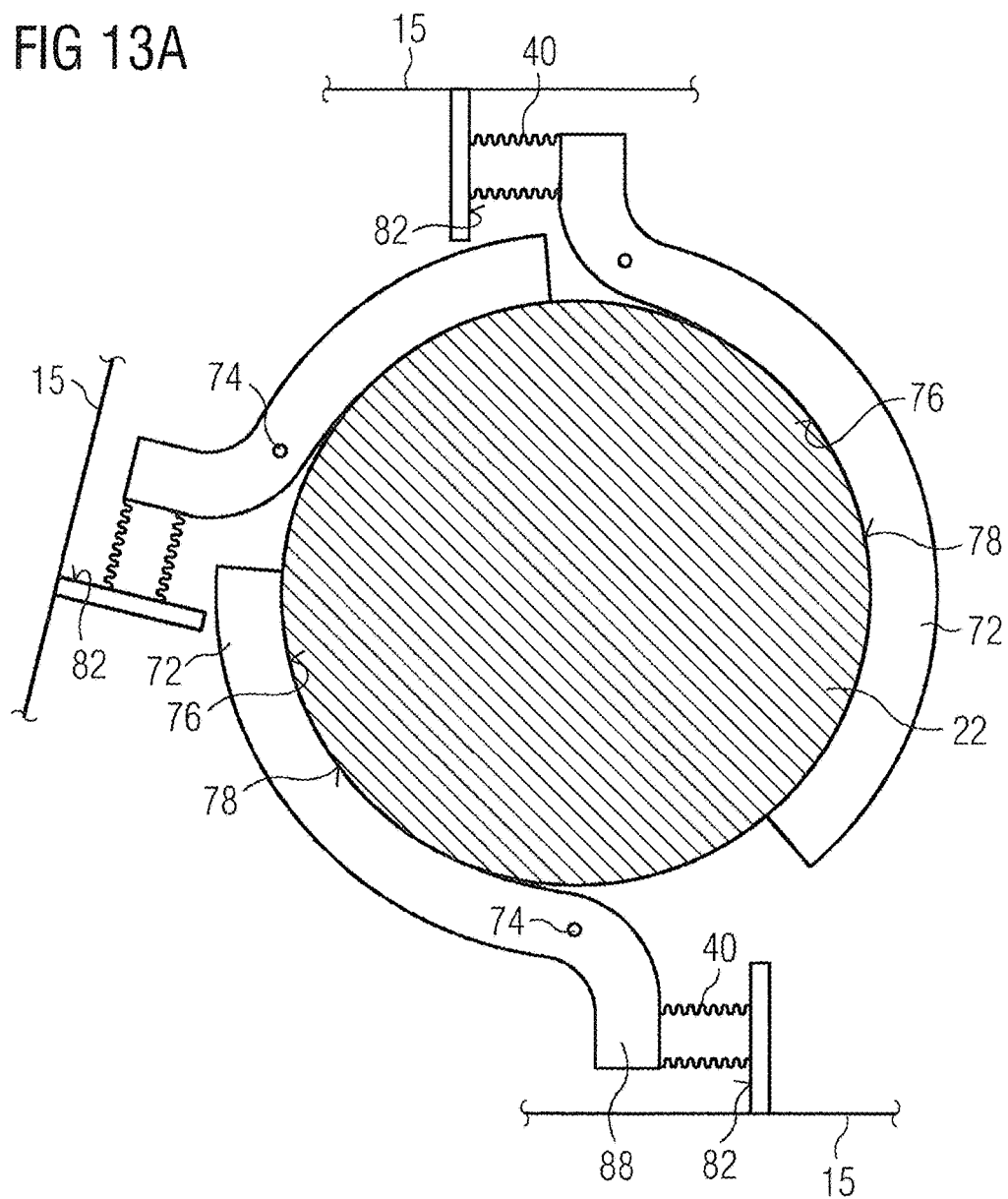

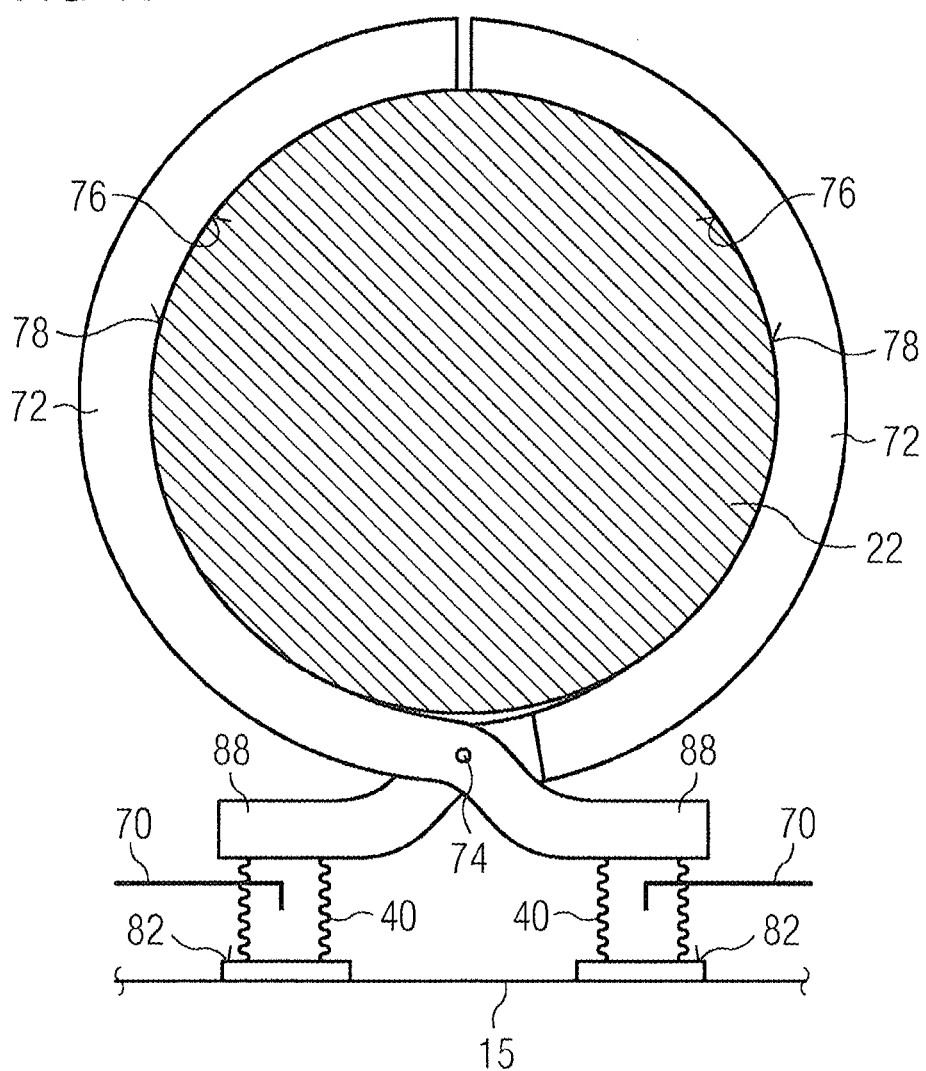

THERMAL CONTACT BETWEEN CRYOGENIC REFRIGERATORS AND COOLED COMPONENTS

RELATED APPLICATION

The present application is a divisional application of Ser. No. 14/785,068, filed on Oct. 16, 2015, the content of which is incorporated herein by reference.

BACKGROUND OF THE INVENTION

Field of the Invention

The present invention relates to improved arrangements for providing thermal connection between a cryogenic refrigerator and cooled components, wherein the refrigerator is removable, and the thermal connection must be capable of being broken and re-made without discernable increase in thermal resistance.

Description of the Prior Art

The present invention is described in the context of a cryogenic refrigerator cooling to temperatures of about 4.2K for re-condensing helium in a cryostat used for cooling superconducting magnets for MRI systems.

FIG. 1 shows a conventional arrangement of a cryostat including a cryogen vessel 12. A cooled superconducting magnet 10 is provided within cryogen vessel 12, itself retained within an outer vacuum chamber (OVC) 14. One or more thermal radiation shields 16 are provided in the vacuum space between the cryogen vessel 12 and the outer vacuum chamber 14. In some known arrangements, a refrigerator 17 is mounted in a refrigerator sock 15 located in a turret 18 provided for the purpose, toward the side of the cryostat. Alternatively, a refrigerator 17 may be located within access turret 19, which retains access neck (vent tube) 20 mounted at the top of the cryostat. The refrigerator 17 provides active refrigeration to cool cryogen gas within the cryogen vessel 12, in some arrangements by recondensing it into a liquid. The refrigerator 17 may also serve to cool the radiation shield 16. As illustrated in FIG. 1, the refrigerator 17 may be a two-stage refrigerator. A first cooling stage 22 is thermally linked to the radiation shield 16, and provides cooling to a first temperature, typically in the region of 80-100K. A second cooling stage 24 provides cooling of the cryogen gas to a much lower temperature, typically in the region of 4-10K.

A negative electrical connection 21a is usually provided to the magnet 10 through the body of the cryostat. A positive electrical connection 21 is usually provided by a conductor passing through the vent tube 20.

Typically, the cryogenic refrigerator will be a two-stage refrigerator, providing high-power cooling to a first cryogenic temperature and lower-power cooling to a much lower cryogenic temperature, as illustrated in FIG. 1. In current cryogenic refrigerators, the first stage may provide about 44 W of cooling to 50K and about 1 W of cooling at about 4K. Typically, a first stage heat exchanger 22 is in thermal contact with the thermal radiation shield 16 as illustrated in FIG. 1.

In some conventional systems, a second stage heat exchanger is exposed to a gaseous cryogen environment in the present example, gaseous cryogen. The second stage is cooled to a temperature below the boiling point of the cryogen, which condenses onto the second stage heat exchanger. Such arrangements provide direct contact between cryogen and second stage heat exchanger, but care must be taken when removing and replacing the refrigerator, since air will tend to be drawn into the cryogen vessel, where it will freeze onto surfaces, and may cause dangerous blockages. The service operation of removing and replacing the refrigerator with the magnet at field is also a hazardous operation, as a quench could take place while the refrigerator is absent, placing a service technician at risk from exposure to liquid and gaseous cryogen.

FIG. 2 schematically illustrates a conventional arrangement in which the cryogenic refrigerator is housed within an enclosure 15, colloquially known as a "vacuum sock", sealed from the interior of the cryogen vessel 12. In this case, the second stage heat exchanger 24 is in thermal contact with gaseous cryogen in the cryogen vessel 12 through a part 26 of a wall of the vacuum sock 15. A heat exchanger surface 28 may be provided on the cryogen vessel side of this part 26 of the wall, to enhance thermal transfer, for example having a finned and/or textured surface. Cooling in this way, by conduction through a wall of the vacuum sock, introduces thermal resistance between the second stage 24 of the refrigerator and the cryogen gas, but provides the advantage that the cryogenic refrigerator 17 may be removed and replaced without exposing the interior of the cryogen vessel 12 to air. Air may enter the vacuum sock 15, but this will solidify inside the vacuum sock when the refrigerator is in use, and does not pose a risk of dangerous blockage. The thermal connection between the first cooling stage 22 and the thermal radiation shield 16 may be provided by a tapered cooling stage 22 and a tapered interface block 30.

It is of course important to ensure effective thermal transfer between the first cooling stage 22 of the refrigerator 17 and the thermal radiation shield 16. This may be achieved, as illustrated, using a tapered first cooling stage 22 and a tapered interface block 30 which is thermally and mechanically joined to the thermal radiation shield 16. The first cooling stage 22 and the interface block 30 are each typically of copper, and the taper angle α is chosen to be narrow enough to ensure a high enough pressure between the surfaces of the first cooling stage 22 and the interface block 30 to ensure good thermal conductivity, but not so narrow an angle that the refrigerator 17 becomes difficult to remove. At an upper end of the refrigerator 17, a flange 32 is bolted 34 to the surrounding surface of the cryostat OVC 14. The dimensions of the various components are carefully calculated such that the first cooling stage 22 and the interface block 30 are driven together with an appropriate force as the refrigerator is tightened into position by bolts 34. Some flexibility in the mounting of the interface block 30 restricts the maximum force to an appropriate level, and allows for some tolerance in the respective dimensions.

Thermal connection must also be provided from the second cooling stage 24 through the wall of the vacuum sock 15. Typically, a part 26 of the wall which contacts the second stage 24 will be of a thermally conductive material such as copper, and may be profiled to provide an enhanced surface 28 for heat exchange on the side which is exposed to the interior of the cryogen vessel. For example, that surface may be finned and/or textured. In certain known arrangements, the various components are dimensioned such that the second cooling stage 24 presses in to wall part 26 with appropriate force and the tapered first cooling stage 22 meets the tapered interface block 30 with appropriate force as the flange 32 is bolted 34 on to the surrounding surface of the cryostat OVC 14. Conventionally, a compliant interface material, typically an indium washer, may be placed between mating surfaces of the wall part 26 and the second cooling stage 24 to allow effective thermal connection while allowing some tolerance in mechanical position. A difficulty with such an arrangement is that the indium washer is destroyed when the refrigerator is removed, and it is difficult to remove all traces of an old indium washer from the inside of the vacuum sock 15. Any remaining traces of an old indium washer will degrade the thermal interface provided by a replacement indium washer.

In the prior art arrangements as discussed above, efficient thermal interfaces between the refrigerator and cooled components have relied upon precise mechanical dimensions. Mechanical force applied when bolting 34 the flange 32 of the refrigerator 17 in place is shared between sealing the refrigerator to the surrounding surface of the cryostat OVC 14, and interface forces between the first cooling stage 22 and the interface block 30; in some embodiments, also interface forces between the second cooling stage 24 and the part 26 of the wall of the vacuum sock. This sharing of forces means that any mechanical tolerance in respective dimensions will change the proportions of force applied at each interface, resulting in unpredictable thermal resistances of the various interfaces. This is usually overcome at the first stage by adding additional thermal links with braids and an axial spring mechanism to allow for build tolerances at the expense of less efficient thermal transfer, caused by an increased number of thermal joints.

SUMMARY OF THE INVENTION

An object of the present invention is to address these problems by providing mounting arrangements for a cryogenic refrigerator wherein an interface force is applied to the first cooling stage 22 in a direction perpendicular to a direction of insertion of the refrigerator 17. The interface force applied to the first cooling stage 22 is thereby independent of the mechanical arrangements for mounting the refrigerator. Accordingly, the mounting force and the interface force may be independently optimized for their respective functions. When the second cooling stage 24 is also subjected to an interface force, the interface force applied to the first thermal interface is in a direction perpendicular to an interface force applied to the second cooling stage. The first stage thermal interface force is independent from the second stage thermal interface force. Increasing one thermal interface force will have no effect on the other thermal interface force.

BRIEF DESCRIPTION OF THE DRAWINGS

FIG. 11 illustrates an optional feature which may be employed with bellows arrangements according to certain embodiments of the present invention.

FIG. 12 schematically illustrates an axially view of a radially outer surface of the refrigerator first stage, with clamping contact pieces in contact with the refrigerator first stage.

FIGS. 12A, 12B and 12C show further embodiments for mounting one or more contact pieces relative to the first refrigerator stage.

FIG. 13 schematically illustrates a further embodiment wherein the contact pieces are assembled in a pliers arrangement.

FIG. 13A illustrates a further embodiment using three contact pieces.

FIG. 17 shows the pliers embodiment of FIG. 13 with conduits for introducing cryogen gas into, or removing cryogen gas from, the respective bellows.

DESCRIPTION OF THE PREFERRED EMBODIMENTS

According to an aspect of the present invention, a thermal link between the thermal radiation shield and the first cooling stage 22 of the cryogenic refrigerator 17 is retracted when a refrigerator is inserted or removed, and the thermal link is pressed into contact with the first cooling stage 22 when in operation by a force acting perpendicular to a force applied to the refrigerator to seal it to the cryostat.

Figure 3:
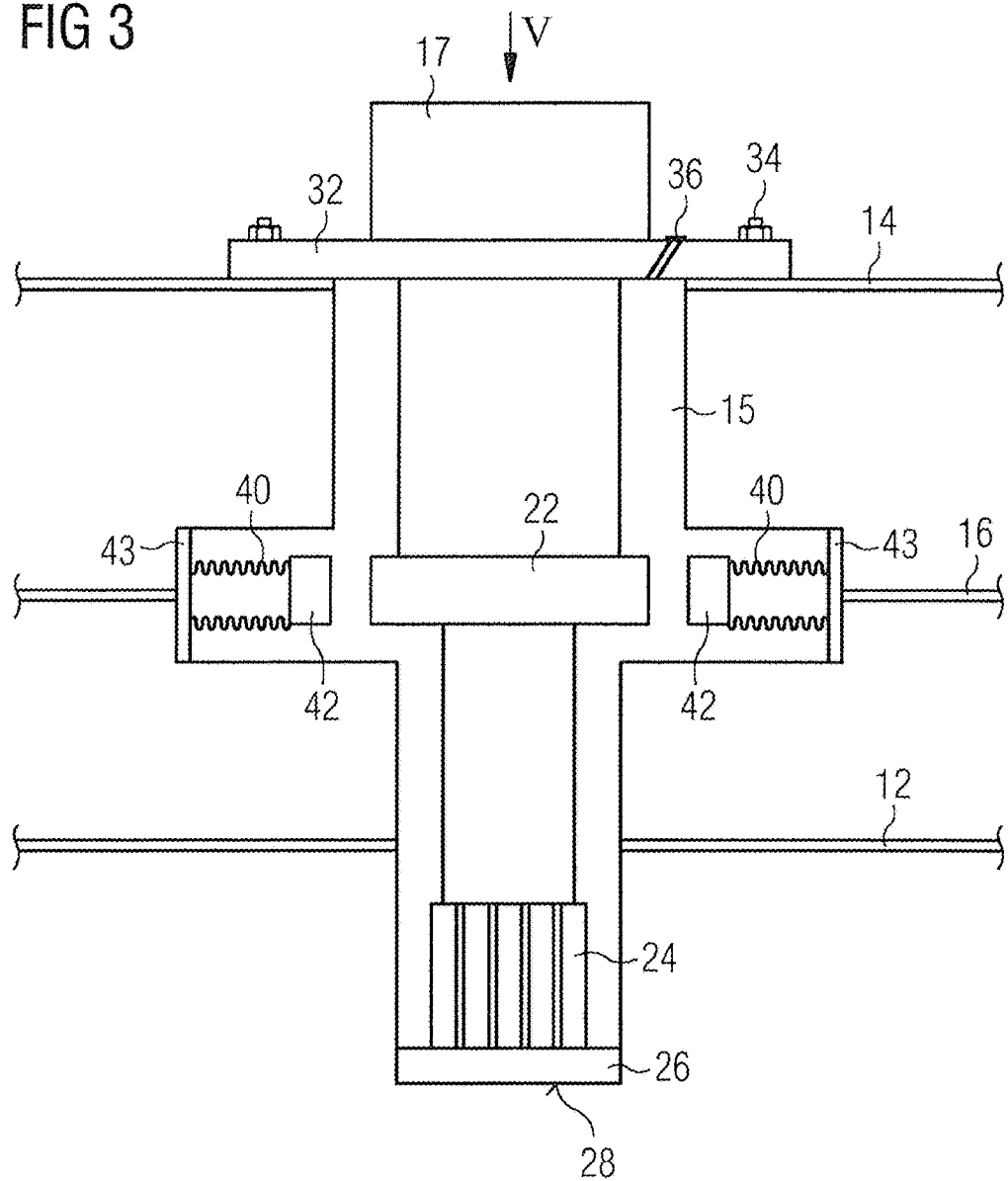
FIG. 3 shows a mounting arrangement for a refrigerator in a cryostat, according to an embodiment of the present invention.

FIG. 3 shows a generic illustration of a first embodiment of the present invention. A vacuum sock 15 is provided, and second cooling stage 24 is in thermal and mechanical contact with a part 26 of the wall of the sock 15. In use, the refrigerator 17 is inserted into the sock 15, and is sealed and mounted in place to the surrounding surface of the cryostat OVC 14. The interior volume of the vacuum sock 15 may be evacuated through a valve 36 or may effectively be evacuated by cryo-pumping when operational: as the refrigerator cools, any air components in the vacuum sock will freeze onto the second cooling stage 24. The vacuum load on the refrigerator: that is, atmospheric pressure acting on the exposed surfaces of the refrigerator, acts to make a firm joint between the second cooling stage 24 and the part 26 of the wall of the vacuum sock 15. None of that load is used to make a thermal contact between the first cooling stage 22 and the thermal radiation shield 16. As a relatively high force is available for making the joint between the second cooling stage 24 and the part 26 of the wall of the vacuum sock 15, it has been found that an effective thermal joint may be made without the use of an indium washer or similar between the second cooling stage 24 and the part 26 of the wall. The entire vacuum load on the top of the refrigerator is available to make the joint between the second cooling stage 24 and the part 26 of the wall. The refrigerator may be bolted 34 or similarly attached to the surrounding surface of the cryostat OVC 14. The force applied to the refrigerator by the bolts 34 or similar fasteners will add to the vacuum load and may contribute to the pressure at the contact surface between the second cooling stage 24 and the part 26 of the wall of the vacuum sock 15. If the vacuum force, and the force applied by bolts, is too high for the second thermal interface, it may be reduced by adding springs under the flange 32, for example around the bolts 34.

Figure 1:
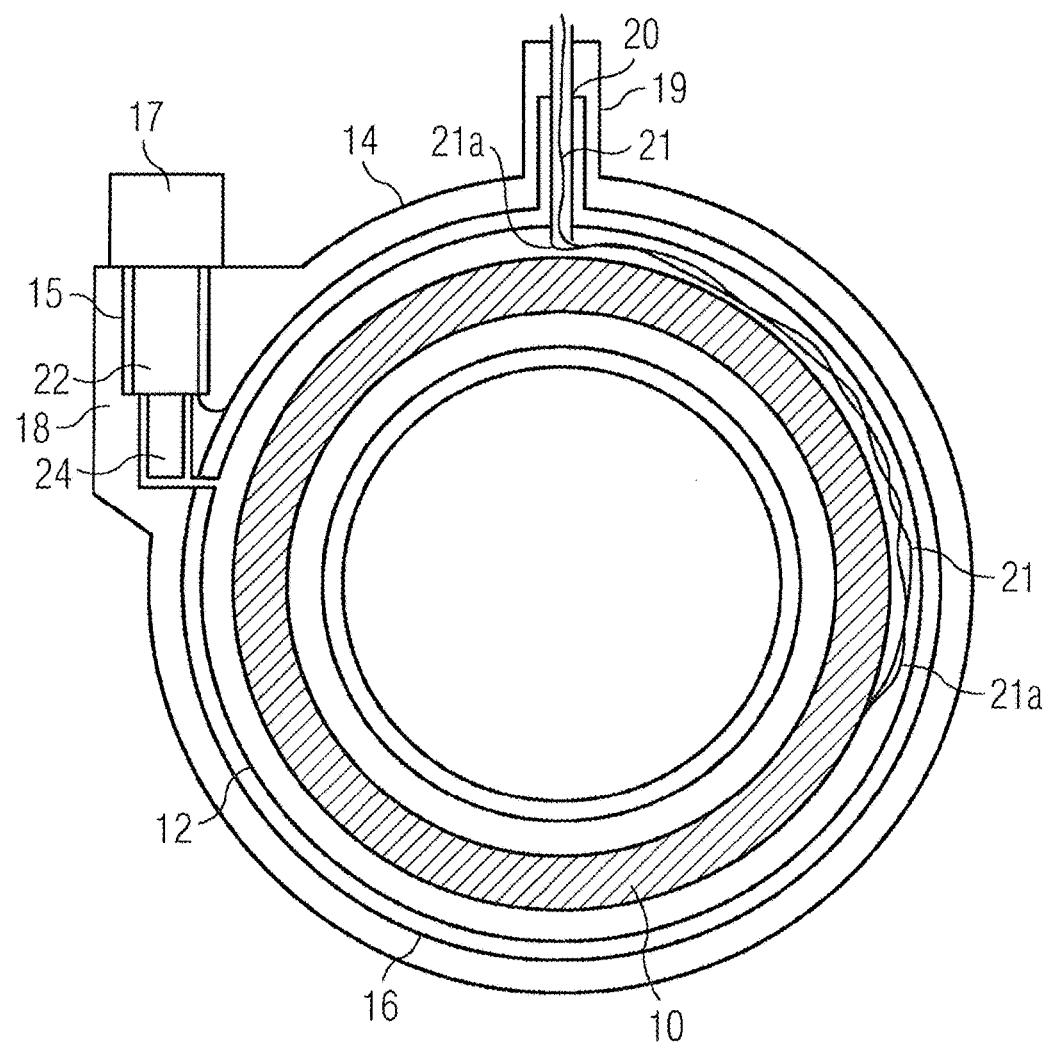
FIG. 1 shows a cross-section through a conventional cryogenically cooled magnet for MRI imaging.
Figure 2:
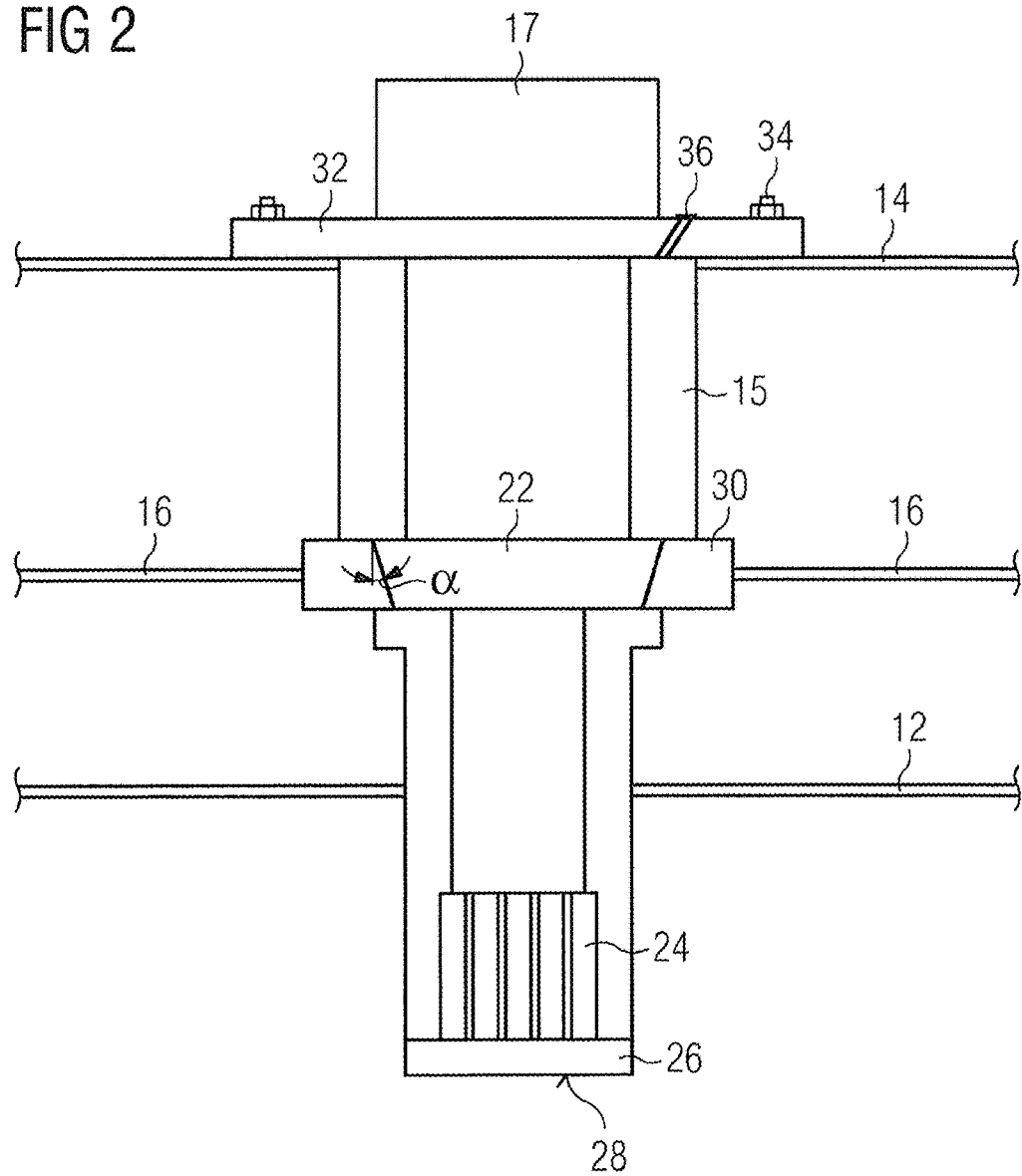
FIG. 2 shows a conventional mounting arrangement for a refrigerator in a cryostat.

According to a feature of this embodiment of the invention, bellows 40 are provided, containing an amount of cryogen which remains gaseous at the temperature of operation of the first cooling stage 22. The cryogen may be helium. The bellows 40 themselves are of thermally conductive material, such as copper or brass, and carry a contact piece 42 of copper or brass at an extremity nearest the refrigerator 17. At the other extremity, the bellows is thermally linked to the thermal radiation shield 16, either by thermal conduction through a thermal plate 43 attached to a wall of the vacuum sock (as illustrated), or through an aperture in the wall of the vacuum sock, the aperture being closed by the bellows and/or an arrangement thermally linking the bellows to the thermal radiation shield. Preferably, a plurality of sets of bellows is provided, equally spaced around the first cooling stage 22. The interface block 30 of FIG. 2 may not be required, representing a valuable saving in cost and weight.

When the vacuum sock 15 is opened to atmosphere, the bellows 40 are driven into a retracted position by atmospheric pressure, as illustrated. The refrigerator 17 may be installed or removed without interfering with the bellows 40. When the vacuum sock is evacuated, either by pumping out through a valve 36 or by cryo-pumping by the refrigerator in use, the pressure within the vacuum sock 15 will fall, and the pressure of the cryogen gas within the bellows 40 will cause the bellows to expand, pressing the contact piece 42 into contact with the first stage 22 of the refrigerator. A thermally conductive path is accordingly established between the thermal radiation shield 16 and the first cooling stage 22. The pressure applied by the bellows 40 onto the first cooling stage 22 is determined by the characteristics of the bellows and the quantity and nature of cryogen gas sealed into the bellows. The vacuum load acting on the top of the refrigerator plays no part in determining the pressure between the contact piece 42 and the first cooling stage 22. As the first cooling stage thermal interface pressure is independent from the second cooling stage thermal interface pressure, both are easy to control. This is advantageous because controlled thermal interface pressure enables accurate calculation and provision of effective thermal contact which is derived from pressure and surface area.

Figure 4:
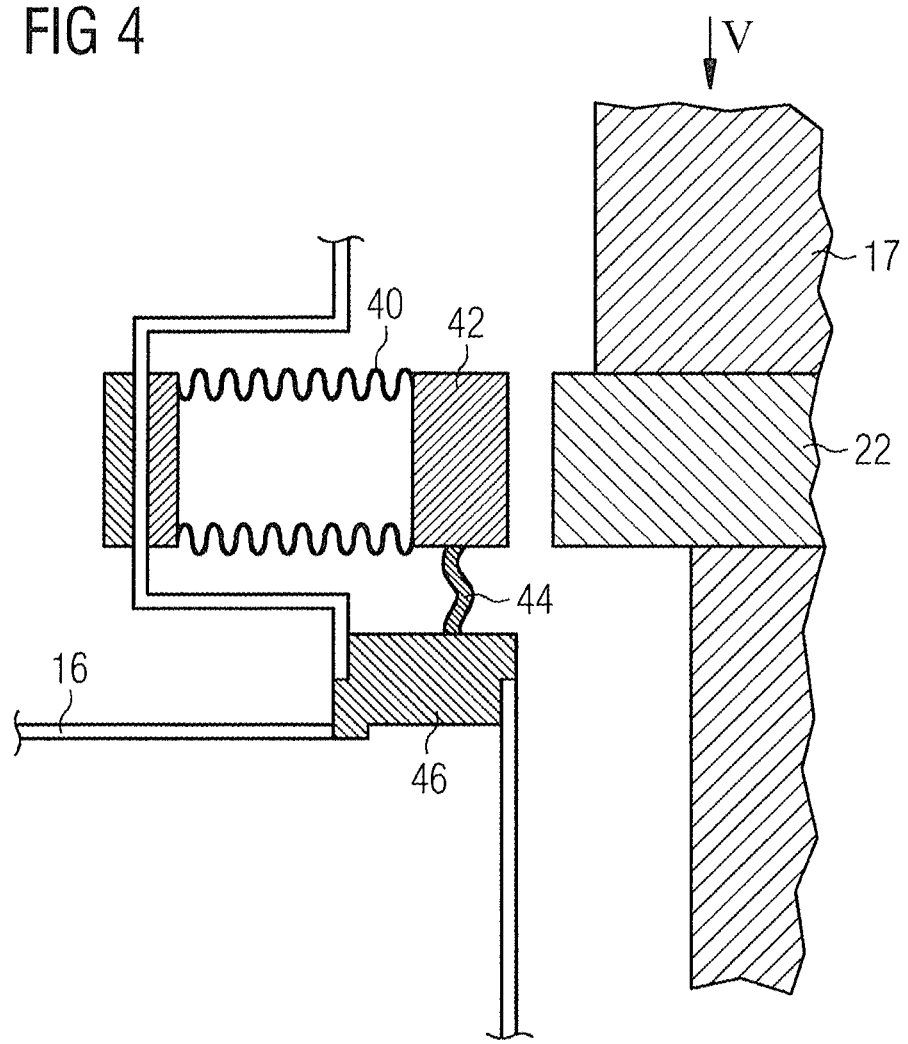
FIG. 4 shows a detail of another mounting arrangement for a refrigerator in a cryostat, according to an embodiment of the present invention.

FIG. 4 shows a detailed view of an alternative bellows arrangement. Here, the contact piece 42 is connected by a flexible thermally conductive joint 44, such as an aluminum or copper braid or laminate, to a block 46, thermally linked to the thermal radiation shield 16. In such embodiments, no thermal conduction need take place through the material of the bellows 40. The bellows may then be of any material of suitable mechanical properties, without being constrained to materials of high thermal conductivity.

If required, mating surfaces of the contact piece 42 and the first cooling stage 22 may have a thin coating of thermally conductive grease or an indium contact to reduce thermal resistance between the two pieces.

Figure 5:
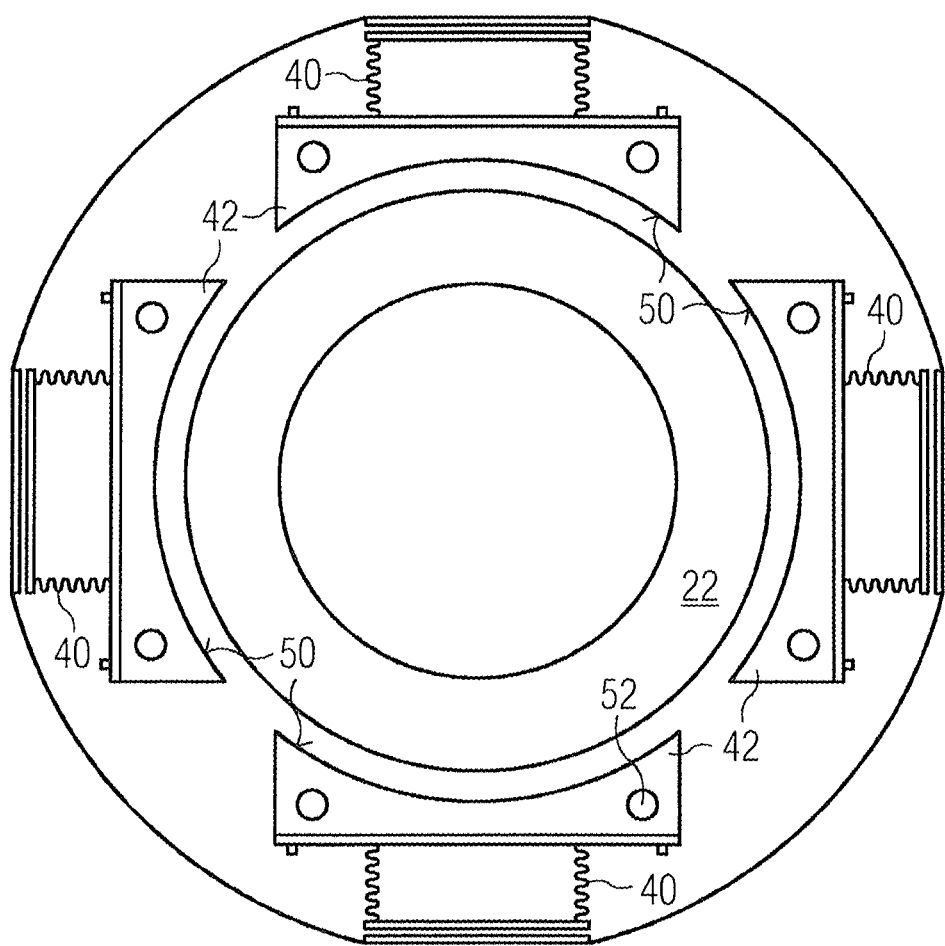
FIG. 5 shows an axial view of certain features of another embodiment of the present invention.

FIG. 5 shows an example embodiment, which may be an embodiment as shown in FIG. 3, or an embodiment as shown in FIG. 4, when viewed in direction V.

As shown, the first stage 22 of the refrigerator is circular in plan, as is conventional. The contact pieces 42 are provided with a corresponding concave surface 50 to increase a contact surface area with the first stage 22. As shown, multiple contact pieces and corresponding multiple bellows may be provided to increase the contact area with the first stage, and reduce the thermal resistance between the first stage 22 and the thermal radiation shield 16 by providing multiple thermal paths in parallel. At 52 are represented through-holes, into which thermally conductive braids may be attached, for example by soldering, in embodiments such as shown in FIG. 4.

Figure 6:
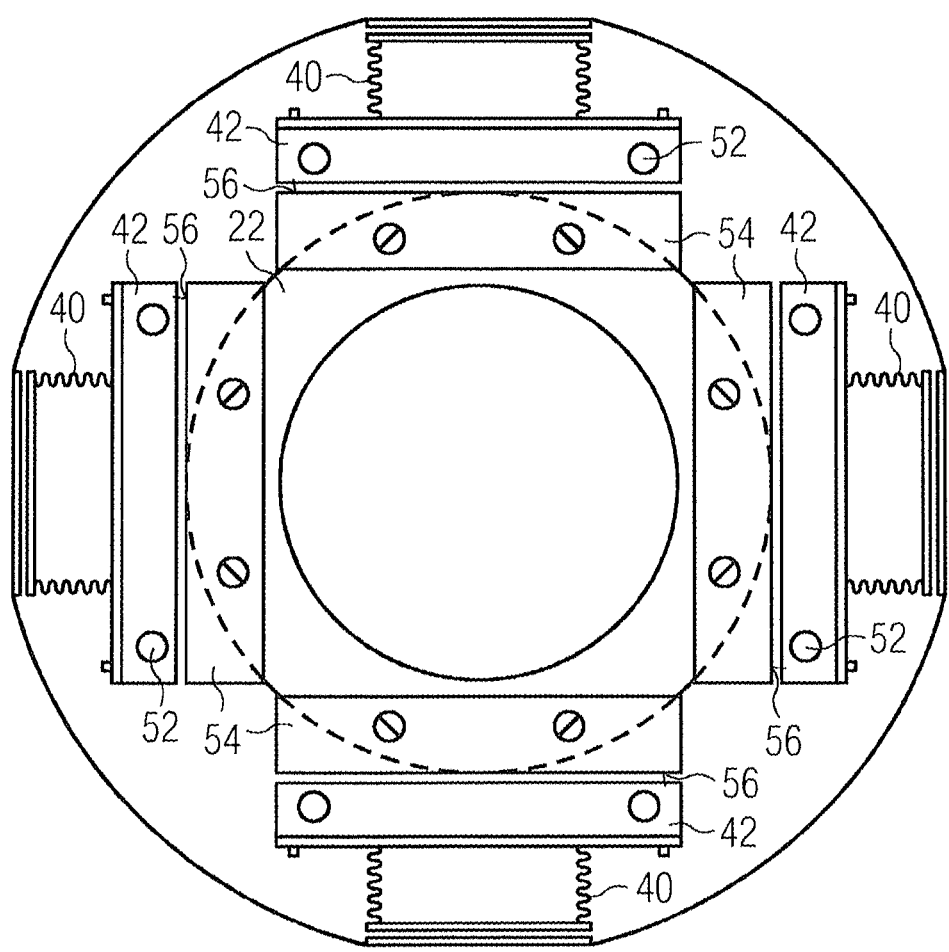
FIG. 6 shows an axial view of certain features of another embodiment of the present invention.

FIG. 6 shows a similar view to that shown in FIG. 5, of an alternative embodiment. Here, instead of using contact pieces which are shaped to match the surface of the first cooling stage 22, thermally conductive blocks 54, for example of copper or aluminum are attached to the first cooling stage, for example by bolting or similar. The thermally conductive blocks 54 each provide a flat mating surface 56 for pressed contact with a corresponding contact piece 42 carried by a bellows 40. Such an arrangement may be found easier to manufacture than the profiled contact blocks shown in FIG. 5.

Figure 7:
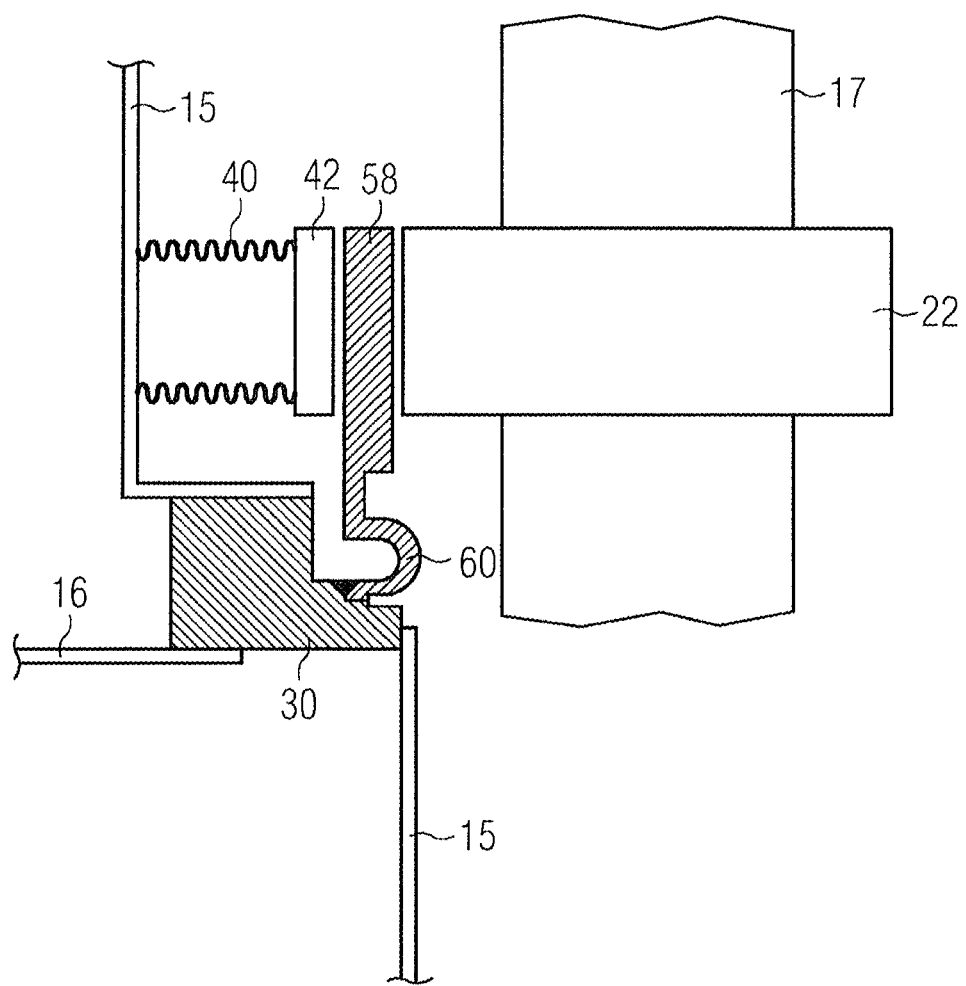
FIG. 7 shows a detail of a mounting arrangement for a refrigerator in a cryostat, according to an embodiment of the present invention.

FIG. 7 illustrates another version of the present invention. Here, thermal contact between the first cooling stage 22 and the first stage interface block 30, which is thermally connected to the thermal radiation shield 16, is provided by a thermal bus bar 58 which is provided with a flexible part, here shown as a joggle 60 in the profile of the bus bar 58. As shown, the vacuum sock 15 is at atmospheric pressure, the bellows are retracted, and the bus bar 58 is not in contact with the first cooling stage. The refrigerator 17 may be inserted or removed without interfering with the bus bar 58, bellows 40 or any of the thermal paths to the thermal radiation shield 16. In use, the vacuum sock 15 will be evacuated. The pressure of cryogen enclosed within the bellows 40 will cause the bellows to elongate. The bellows 40 and contact piece 42 will bear upon the thermal bus bar 58 and bend it about its flexible portion 60 such that it enters into thermal contact with the first cooling stage 22. Such embodiments are advantageous in that no modification needs to be made to the refrigerator 17 itself: there is complete freedom in choice of material of the bellows, as no thermal conduction need take place through the bellows. The material cross-sectional area of the thermal path through the bus bar 58 including its flexible part 60 may be significantly greater than the material cross-sectional area of the bellows, braiding or laminate 44 used to conduct heat in the other embodiments discussed above.

Figure 8:
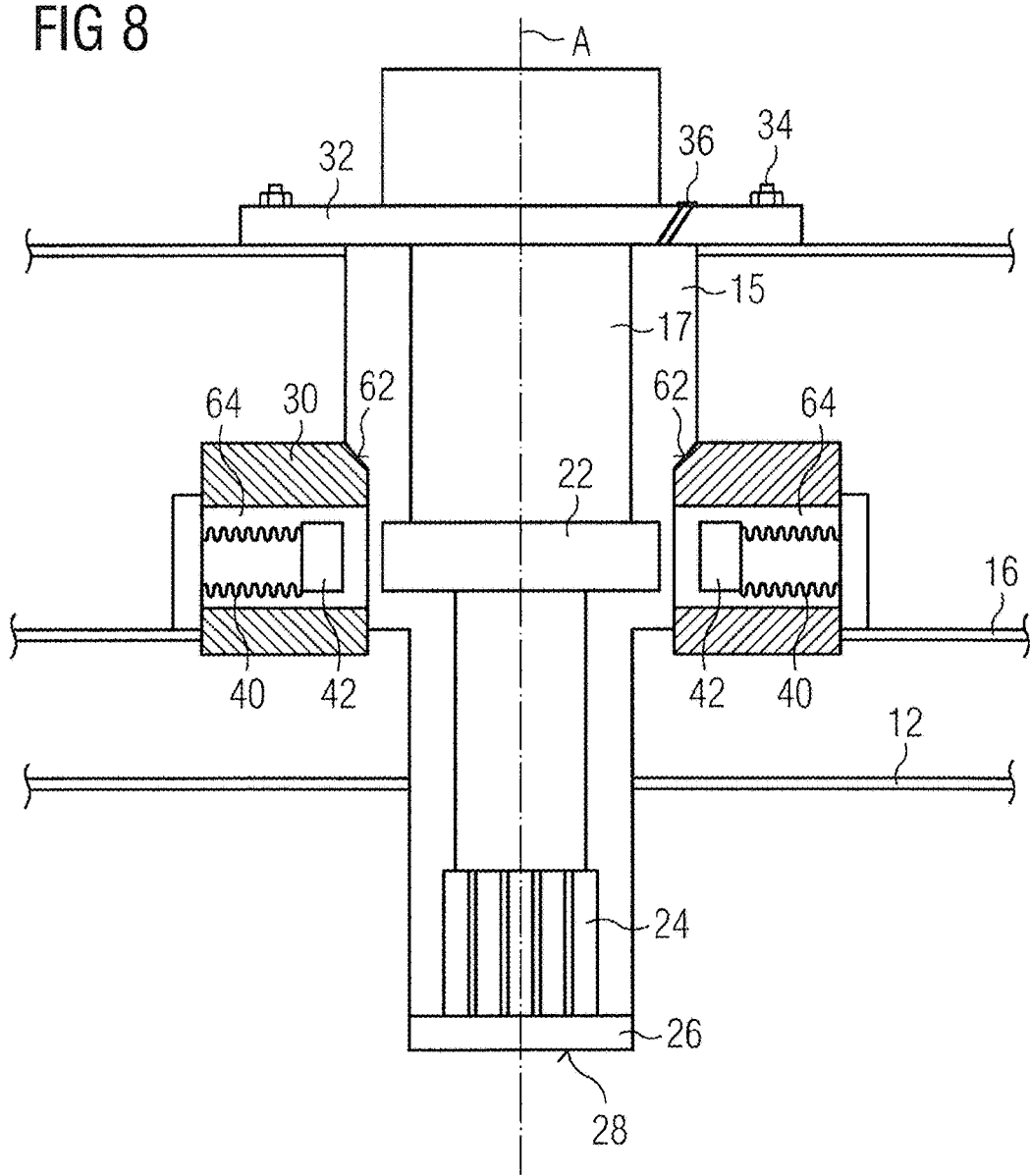
FIG. 8 shows a mounting arrangement for a refrigerator in a cryostat, according to an embodiment of the present invention.

FIG. 8 shows another embodiment of the present invention. Here, the first stage thermal intercept block 30 is a relatively close fit around the first cooling stage 22 of the refrigerator 17. An upper surface 62 of the first stage thermal interface block 30 is preferably tapered to assist installation of the refrigerator 17. When correctly aligned, the first cooling stage 22 passes unimpeded through the first stage thermal interface block 30. As shown, one or more recesses or ports 64 are provided in the material of the first thermal interface block 30. A bellows 40 is provided in each of the recesses or ports 64. Each of the bellows 40 may be arranged according to any of the embodiments described above, or any similar arrangement. In the embodiment schematically represented in FIG. 8, the bellows may correspond to the embodiment of FIG. 3: the bellows are of a thermally conductive material and the first cooling stage 22 cools the thermal radiation shield 16 by conduction through contact piece 42, bellows 40 and interface block 30 to the shield 16. As in the case with the other embodiments described, the interface force of the thermal contact with the first cooling stage 22 is directed radially to an elongate axis A-A of the refrigerator, and perpendicular to an interface force of the thermal contact with the second cooling stage, which is directed parallel to the elongate axis A-A of the refrigerator.

Figure 9:
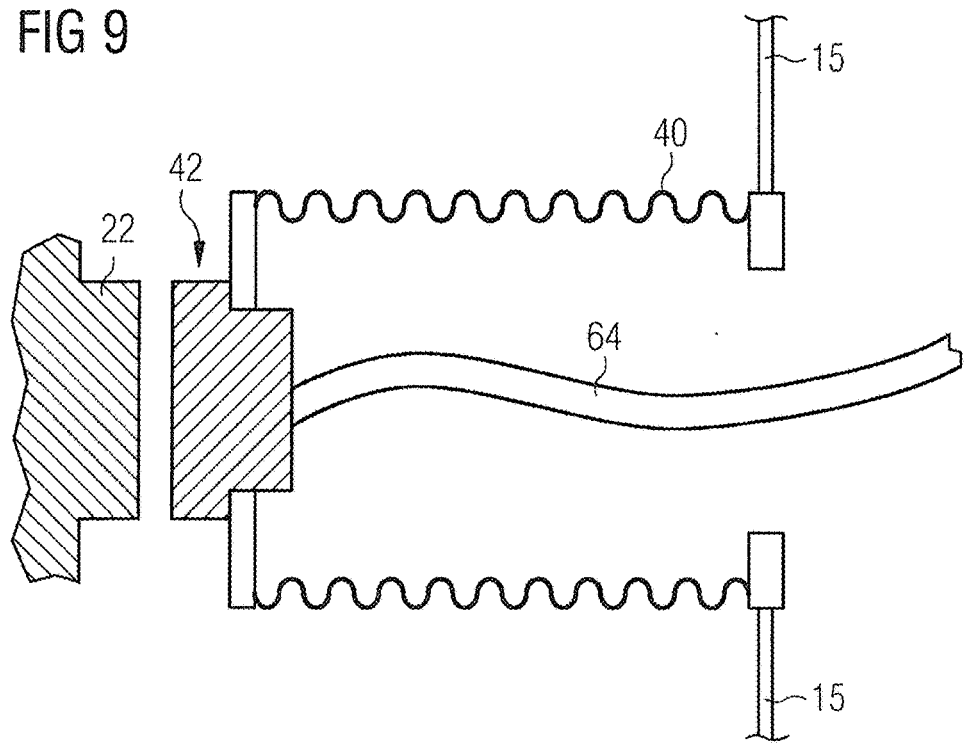
FIG. 9 illustrates a detail of a bellows arrangement used in an embodiment of the present invention.

FIG. 9 shows a detailed representation of a bellows arrangement of a particular embodiment of the invention. Here, a flexible thermal conductor 64 is provided, such as a copper or aluminum braid. One end of the flexible conductor 64 is affixed to an interface piece 42 provided at a radially inner end of the bellows 40. The flexible conductor extends the length of the bellows 40 to a fitting (not shown), in thermal contact with the thermal radiation shield 16. The bellows is naturally extended in its "rest" state and is forced into a retracted position when the vacuum sock is at atmospheric pressure.

Figure 10:
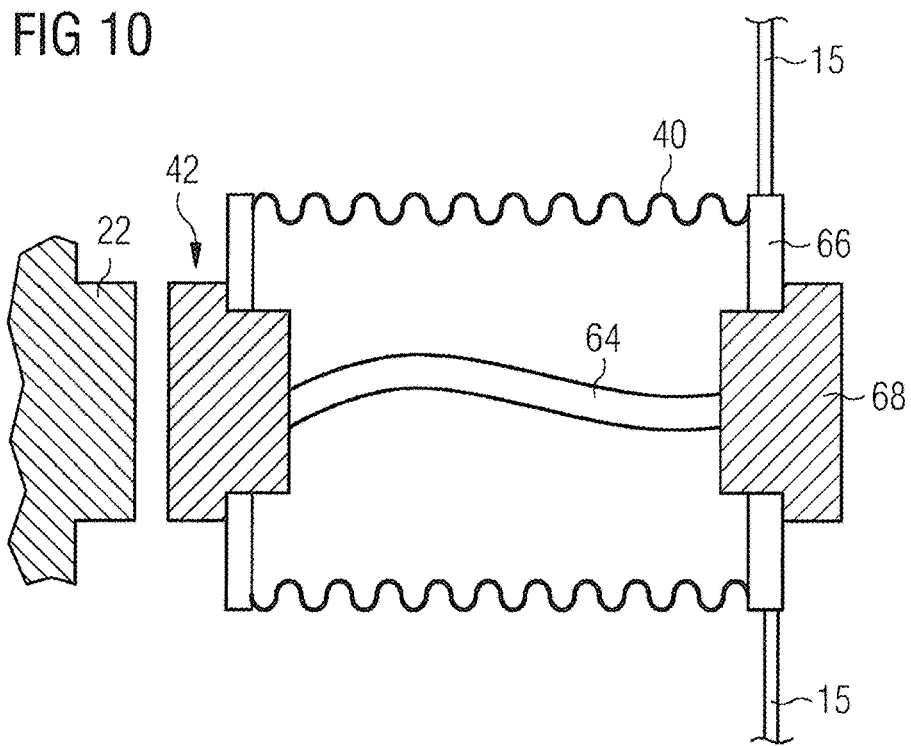
FIG. 10 illustrates a detail of an alternative bellows arrangement used in another embodiment of the present invention.

FIG. 10 shows a detailed representation of another bellows arrangement of the present invention. This arrangement is somewhat similar to the arrangement of FIG. 9, in that a flexible thermal conductor 64 extends through the bellows 40, and is joined to interface piece 42 at a surface within the bellows 40. At the radially outer end of the bellows, a similar interface piece 68 is provided, and sealed to a wall of the vacuum sock 15 with an end plate 66. Another thermal link (not illustrated) will be provided between the interface piece 68 and the thermal radiation shield 16. The force and pressure applied by the bellows at the first thermal interface may be varied by design of the bellows and the interface piece 42. Increasing the cross-sectional area of the bellows will increase the interface force, as will increasing the length of bellows in the radial direction. Reducing a surface area of the interface piece 42 will not change the interface force, but will raise the interface pressure.

FIG. 11 schematically represents an improved embodiment of the present invention. Here, a small bore pipe 70 is shown, communicating with an interior volume of each of the bellows 40. Another end of the pipe 70 passes through the wall of the cryostat to a supply of a gas. Rather than relying simply on a difference in pressure between the interior of the vacuum sock 15 and the interior of the bellows 40 which contains a fixed mass of cryogen gas, this embodiment allows an increased pressure to be provided within the bellows 40 by adding a gas such as neon, argon or helium once the vacuum sock is at vacuum. This may allow improved thermal conductivity between the interface piece 42 and the first cooling stage 22 by increasing the contact pressure between the interface piece 42 and the first cooling stage. Some heat transfer also takes place through the gas in the bellows. Preferably, gas is removed through pipe 70 from the bellows 40 when the refrigerator 17 is to be removed, allowing the bellows to retract away from the first cooling stage, providing clearance for removal of the refrigerator.

FIGS. 12-16 represent a series of further embodiments, in which thermal interface pieces are arranged to rotate about certain axes into contact with refrigerator first stage 22 when the refrigerator is in position and under vacuum in the sock 15, and to rotate out of contact with the refrigerator first stage 22 when the interior of the sock 15 is at atmospheric pressure during servicing operations. In some embodiments, one or more bellows is used, which contains a sealed mass of cryogen gas, such that the bellows will elongate when the sock 15 is at vacuum, and will retract when the interior of the sock is at atmospheric pressure. In other embodiments, one or more bellows are provided with a pipe 70, as described with reference to FIG. 11, which allows the pressure within the respective bellows to be controlled at will.

FIG. 12 schematically illustrates an axial view of a radially outer surface of the refrigerator first stage 22 with clamping contact pieces 72 in position, in contact with the refrigerator first stage. Clamping contact pieces 72 pivot about axle 74. In their closed position, illustrated, radially inner surfaces 76 of the clamping contact pieces 72 are pressed into contact with a radially outer surface 78 of the refrigerator first stage 22. The radially inner surfaces 76 of the clamping contact pieces 72 are shaped to provide a large contact surface area between the clamping contact pieces and the refrigerator first stage 22. Part of a wall of sock 15 is schematically shown. According to this embodiment of the invention, sealed bellows units 40 are provided, each between an actuator 80 attached to, or forming part of, each clamping contact piece 72 and a bearing surface 82 mechanically restrained in a fixed position with respect to the sock 15. Axle 74 is preferably also restrained in position with respect to the sock 15 to carry some of the weight of the clamping contact pieces 72. FIG. 12 illustrates the assembly in the case that the sock 15 is evacuated. A predetermined mass of a cryogen gas is sealed into each bellows 40. When the sock is evacuated, the pressure of the cryogen within the bellows causes it to elongate, and to bear against the respective actuator 80 and bearing surface 82. The bellows accordingly presses the contact pieces 72 into thermal and mechanical contact with the first stage of the refrigerator. A thermal link, such as any of those described above with reference to other embodiments may be used to provide a cooling path from the contact pieces 72 to the first stage of the sock, and so to the thermal radiation shield. The bellows may be adapted in length, and diameter to provide an appropriate force to clamp the contact pieces 72 against the first stage of the refrigerator.

When the sock is at atmospheric pressure, the pressure differential between the sock and the bellows will reduce and may even reverse in sign. This will cause the bellows to compress. The ends of the bellows 40 are respectively attached to the actuator 80 and the bearing surface 82, and the contracting bellows disengage the surfaces 76 of the contact pieces 72 from the first stage 22 of the refrigerator. The contact pieces 72 are shaped in the region of the axle 74 to ensure that an uninterrupted clearance space is provided around the first stage of the refrigerator when the bellows are compressed: when the sock is at atmospheric pressure. This allows the refrigerator to be removed and replaced unimpeded.

Figure 16:
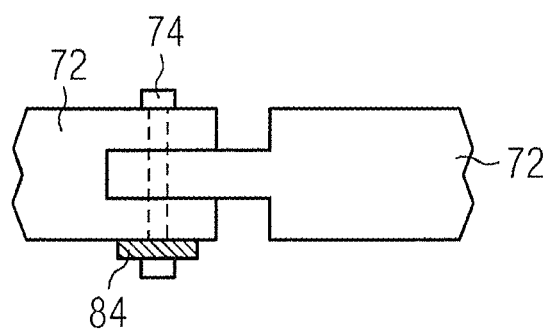
FIG. 16 shows an embodiment of the arrangement of contact pieces relative to the axle.

FIG. 16 shows a possible arrangement of the contact pieces 72 adjacent to the axle 74, in the direction XVI shown in FIG. 12. Ends of the contact pieces interlock and axle 74 passes through both of them. A thermal connector 84 may conveniently be attached to the contact pieces at the axle 74.

In alternative embodiments, fewer or more than two contact pieces may be provided, each associated with a bellows 40, and axle 74 and a bearing surface 82. In other embodiments, the actuator 80 may be dispensed with, the bellows 40 arranged essentially radially to bear against a part of each contact piece preferably distant from the corresponding axle 74. FIGS. 12A, 12B and 12C schematically illustrate such embodiments.

FIG. 13 schematically illustrates another type of embodiment, wherein the contact pieces are assembled in a manner similar to a pair of pliers, in that a part which contacts the first stage 22 of the refrigerator is arranged on one side of an axle 74, while an extension piece 88 extends on the opposite side of the axle and is used to actuate the arrangement. In the illustrated embodiment, each contact piece is actuated with a corresponding bellows 40. When the sock 15 is at atmospheric pressure, each bellows 40 is compressed, and the surface 76 of each contact piece is pulled away from the surface 78 of the first stage of the refrigerator 22. A spring (not shown) may be provided to push the contact pieces away from the first stage 22 of the refrigerator. When the sock is at vacuum, the cryogen gas within each bellows causes the bellows to elongate, and the contact pieces 72 to press into contact with the first stage 22 of the refrigerator. Other features shown in FIG. 13 correspond to features of FIG. 12.

In variants of the embodiment of FIG. 13, more or fewer than two contact pieces may be provided, each with their own axle. FIG. 13A illustrates one of these variants.

Figure 14:
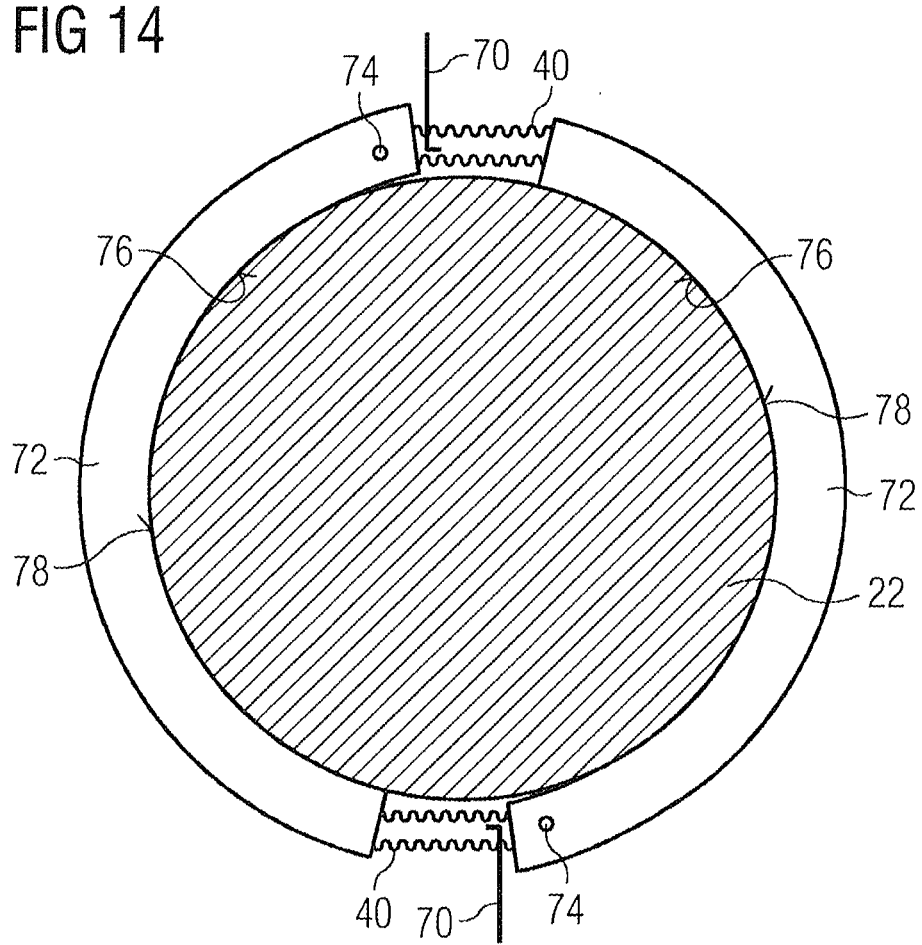
FIG. 14 illustrates a further embodiment wherein a conduit is provided to introduce cryogen gas into, or remove cryogen gas from, each bellows.
Figure 15:
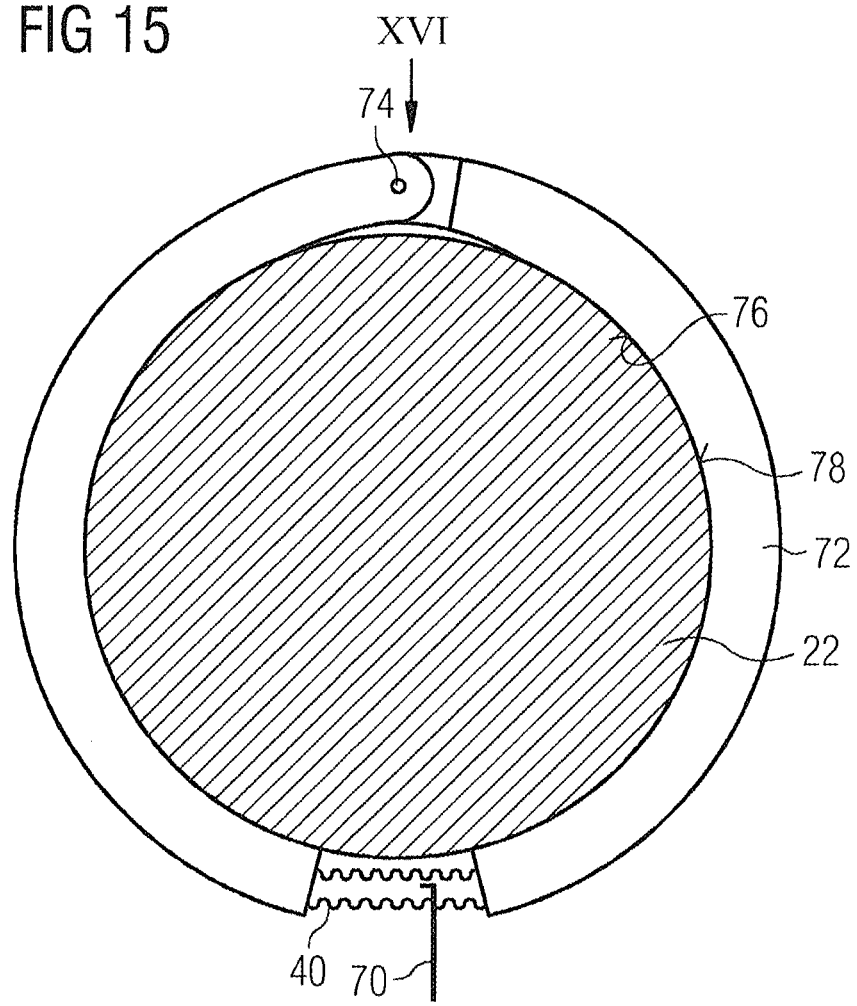
FIG. 15 illustrates another embodiment wherein a conduit is provided to introduce cryogen gas into, or remove cryogen gas from, one bellows.

FIGS. 14, 15, 17 illustrate embodiments in which a pipe 70 is provided to introduce or remove cryogen gas from each bellows. Such an arrangement has been discussed above with reference to FIG. 11. In such arrangements, cryogen gas is introduced into the bellows 40 when the sock is at atmospheric pressure and drives the contact pieces 72 out of contact with the first stage 2 of the refrigerator. When the sock is at vacuum, cryogen gas is withdrawn from the bellows, to pull the contact pieces 72 into contact with the first stage 22 of the refrigerator. Numerous variations of such embodiments are possible within the scope of the invention, as will be apparent to those skilled in the art in a manner similar to the variants shown in FIGS. 12-13A.

The invention claimed is:

1. An arrangement for mounting a two stage cryogenic refrigerator into a cryostat, the arrangement comprising:
    a vacuum sock for accommodating at least a part of the refrigerator;
    attachment means for attaching an upper part of the refrigerator to a surface of the cryostat around an opening of the vacuum sock;
    a thermally conductive portion of a wall of the vacuum sock which, in use, is thermally and mechanically in contact with a second cooling stage of the refrigerator;
    arrangements are provided for thermally connecting a first stage of the refrigerator to a thermal radiation shield of the cryostat;
    the said arrangements comprising a bellows structure within the vacuum sock, the bellows structure containing a sealed mass of cryogen gas, whereby said bellows structure is in a retracted position when the vacuum sock is at atmospheric pressure, and which is in an extended position when the vacuum sock is under vacuum, wherein, in its extended position, the bellows presses a thermally conductive contact piece into thermal and mechanical contact with a first cooling stage of the refrigerator; and
    wherein the thermally conductive contact piece is arranged to rotate about an axle in response to the bellows structure being in a retracted position when the vacuum sock is at atmospheric pressure, and being in an extended position when the vacuum sock is under vacuum.

2. An arrangement for mounting a two stage cryogenic refrigerator into a cryostat as claimed in claim 1 wherein said refrigerator is elongate in an axial direction, and wherein said axle is parallel to said axial direction.

3. An arrangement for mounting a two stage cryogenic refrigerator into a cryostat as claimed in claim 2 wherein said thermally conductive contact piece comprises an arcuate element that at least partially surrounds said first stage of the refrigerator, said arcuate element having an end connected to said bellows structure and a free end opposite said end connected to said bellows structure, and wherein said axle proceeds through said free end of said arcuate element.

4. An arrangement for mounting a two stage cryogenic refrigerator into a cryostat as claimed in claim 2 wherein said thermally conductive contact piece comprises an arcuate body having an end connected to said bellows structure and a free end opposite said end connected to said bellows structure, and wherein said axle proceeds through said end of said arcuate body connected to said bellows structure.

\* \* \* \* \*